(12) United States Patent
Crain et al.

(10) Patent No.: US 7,485,989 B2
(45) Date of Patent: Feb. 3, 2009

(54) TUNABLE ELECTRICAL TRANSIENT GENERATOR FOR ELECTROMAGNETIC PULSER

(75) Inventors: Charles Crain, Colorado Springs, CO (US); Philip Lane, Colorado Springs, CO (US); John McClure, Colorado Springs, CO (US); James Youngman, Woodland Park, CO (US)

(73) Assignee: L-3 Communications Corporation, New York, NY (US)

( * ) Notice: Subject to any disclaimer, the term of this patent is extended or adjusted under 35 U.S.C. 154(b) by 315 days.

(21) Appl. No.: 11/523,879

(22) Filed: Sep. 20, 2006

(65) Prior Publication Data
US 2008/0067875 A1 Mar. 20, 2008

(51) Int. Cl.
*H03K 3/00* (2006.01)
(52) U.S. Cl. .................................... 307/106
(58) Field of Classification Search ........... 307/106
See application file for complete search history.

(56) References Cited

U.S. PATENT DOCUMENTS

| | | | |
|---|---|---|---|
| 3,289,015 A | 11/1966 | Fitch | |
| 3,496,378 A | 2/1970 | Sakamoto | |
| 3,832,569 A | 8/1974 | Anderson et al. | |
| 3,864,541 A | 2/1975 | Inoue | |
| 4,004,123 A | 1/1977 | Inoue | |
| 4,617,542 A | 10/1986 | Lutz et al. | |
| 5,311,067 A * | 5/1994 | Grothaus et al. | 307/108 |
| 6,291,791 B1 | 9/2001 | Fujita et al. | |
| 6,355,992 B1 | 3/2002 | Via | |

* cited by examiner

*Primary Examiner*—Robert L. Deberadinis
(74) *Attorney, Agent, or Firm*—Fitch, Even, Tabin & Flannery (57) ABSTRACT

A system for generating a high voltage energy pulse comprises a capacitive energy storage arrangement that is coupled to a direct current (DC) power supply. The capacitive energy storage arrangement stores energy from the power supply. The system also includes a pulse forming network for forming frequency contents of a high voltage energy pulse. A dielectric insulated mechanical switch is coupled to the capacitive energy storage arrangement and the pulse forming network. The dielectric insulated mechanical switch is immersed in a dielectric substance. A controller is coupled to the dielectric insulated mechanical switch. The controller is programmed to selectively open and close the dielectric insulated mechanical switch so as to supply energy stored in the capacitive energy storage device to the pulse forming network and thereby form the high voltage energy pulse.

16 Claims, 4 Drawing Sheets

TUNABLE ELECTRICAL TRANSIENT GENERATOR FOR ELECTROMAGNETIC PULSER

FIELD OF THE INVENTION

The field of the invention relates to electromagnetic pulse generation and, more specifically, to generating high voltage electrical pulses for testing and other purposes.

BACKGROUND OF THE INVENTION

Electrical pulses can be generated in a number of different ways and are used for a variety of purposes. Electrical pulses, for example, are used for testing purposes in different civilian and military applications. Typically, a high voltage pulse is developed in these arrangements and applied to a device or network under test. Thereafter, the results of the test can be analyzed and modifications/alterations can be made to the circuitry under test, based upon the test results.

Electromagnetic pulse generation typically involves tens of thousands of kilo volt transients injected into a test device or network with rise rates in the nanosecond to microsecond range, and pulse widths of hundreds of nanoseconds to milliseconds. In one example of an approach for generating pulses, a capacitor is charged to a set voltage and then discharged rapidly into a pulse forming network of inductors and resistors that shape the output pulse into the desired amplitude and wave form.

In some previous approaches, mechanical spring or actuator electrode switches discharged the energy stored in the capacitor into the pulse forming network by physically contacting the switch contacts with one another, much like a light switch, but at a much faster rate. Unfortunately, in air, the two contacts arced over short distances prior to the actual touching, thereby causing severe degradations in the rise rate of the pulse. These variations made previous mechanical switches unsuitable for high voltage pulse forming applications.

In other previous approaches, electromagnetic pulse generation systems used pressurized, non-contacting spark gap switches to generate fast rise rate pulses. Pressurized gas spark gaps can hold off the required voltage and, when triggered by a second high voltage sourced, ionize the insulating gas and create a plasma discharge channel through which the capacitor discharges into the pulse forming network generating an electromagnetic pulse. Unfortunately, previous pressurized spark gap switches operate in a very limited area of hold off voltages making these types of switches unsuitable for many applications.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

SUMMARY OF THE INVENTION

Systems and methods are provided that immerse mechanical contact switches in a gas or liquid dielectric and use the switches to generate frequency contents of a high voltage pulse. In some preferred approaches, gases are used to insulate the switch for low voltage and low current applications and liquids are used to insulate the switch for high voltage and high current applications. The use of the dielectric allows the contacts of the switch to almost physically touch before the current arc is drawn between the two contacts. This approach limits the impact on the rise rate of the electromagnetic pulse, can be used in both high and low voltage/current applications, and operates across a wide spectrum of hold off voltages.

In many of these embodiments, a capacitive energy storage arrangement is coupled to a direct current (DC) power supply. The capacitive energy storage arrangement stores energy from the power supply. A pulse forming network forms frequency contents of a high voltage energy pulse and a dielectric insulated mechanical switch is coupled to the capacitive energy storage arrangement and the pulse forming network.

The dielectric insulated mechanical switch is immersed in a dielectric substance and a controller is coupled to the dielectric insulated mechanical switch. The controller is programmed to selectively open and close the dielectric insulated mechanical switch so as to supply energy stored in the capacitive energy storage device to the pulse forming network and thereby form the high voltage energy pulse.

The dielectric insulated mechanical switch may take a variety of forms and configurations. For example, the dielectric insulated mechanical switch may comprise a pair of electrodes (contacts) driven by a mechanical spring. In another example, the dielectric insulated mechanical switch may comprise a pair of electrodes driven by a solenoid.

The pulse forming network may assume a number of different forms and contain a variety of different types of components. In one example, the pulse forming network may include at least one resistive element and at least one inductive element. In another example, the pulse forming network may contain multiple resistive elements, multiple inductive elements, and multiple capacitive elements.

A variety of different dielectric substances may be used. In one example, the dielectric substance comprises a dielectric gas. The dielectric may be a high dielectric breakdown voltage such as a sulfur hexafluoride gas, a nitrogen-based gas, or a noble gas. In addition, the gas may be a pressurized gas or a non-pressurized gas.

In other examples, the dielectric substance may be a dielectric liquid exhibiting a high voltage insulating quality. For instance, the dielectric liquid may be a petrochemical-based oil, an organic-based oil, or de-ionized water.

Thus, approaches are provided that generate high voltage electromagnetic pulses. Advantageously, these approaches limit the impact on the rise rate of the electromagnetic pulse, can be used in both high and low voltage/current applications, and operate across a spectrum of hold-off voltages.

DETAILED DESCRIPTION OF THE PREFERRED EMBODIMENTS

Figure 1:
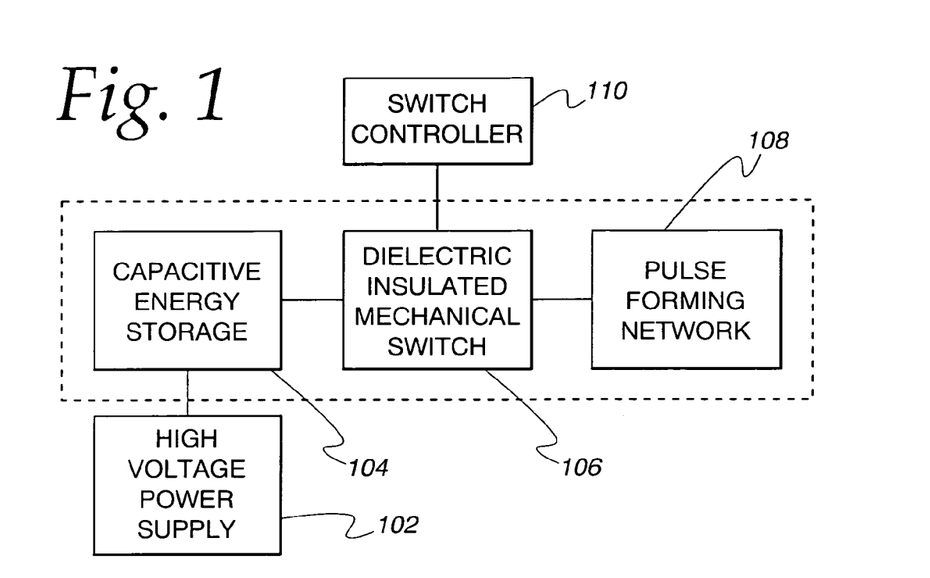
FIG. 1 is a block diagram of a system for generating a high voltage electromagnetic pulse according to various embodiments of the present invention.

Referring now to FIG. 1, one example of a system for creating an electromagnetic pulse is described. A high voltage power supply 102 is coupled to a capacitive energy storage device 104. The capacitive energy storage device 104 is coupled to a dielectric insulated switch 106. The dielectric insulated switch 106 is coupled to a pulse forming network 108. A switch controller 110 is also coupled to the dielectric insulated mechanical switch 106.

The high voltage power supply 102 is a high voltage power source such as a high-voltage DC power supply. For example, a Glassman PS/FC03P40.1-11 3 kV DC power supply may be used to charge the capacitive energy storage device 104.

The capacitive energy storage device 104 stores the energy received from the high voltage power supply 102. In one example, the capacitive energy storage device 104 may comprise banks of capacitors and these capacitors may be arranged in any configuration. In one example, the capacitors may be connected in series. For instance, six 100 micro Farad capacitors may be connected in series.

The dielectric insulated switch 106 is an insulated switch that passes energy between the capacitive energy storage device 104. In one example, the switch 106 may be a switch as described below with respect to FIGS. 3a-c. In another example, the switch 106 may be a Kilovac K70A841 relay. Other examples of switches are possible.

The dielectric insulated switch 106 is immersed in a dielectric substance, which may take a number of different forms. In one example, the dielectric substance comprises a dielectric gas. This dielectric gas may have a high dielectric breakdown voltage and be a substance such as a sulfur hexafluoride gas, a nitrogen-based gas, or a noble gas. In addition, the gas may be a pressurized gas or a non-pressurized gas.

In other examples, the dielectric substance may be a dielectric liquid that exhibits a high voltage insulating quality. For instance, the dielectric liquid may be a petrochemical based oil, an organic-based oil, or de-ionized water.

The pulse forming network 108 creates frequency contents of a pulse having a desired waveform and amplitude from energy received from the dielectric insulated switch 106. The pulse forming network 108 can take a variety of forms. In one example, the pulse forming network 108 comprises at least one resistive element and one inductive element. In another example, the pulse forming network 108 comprises multiple resistive elements, multiple inductive elements, and multiple capacitive elements.

The switch controller 110 is any type of controller or control circuit such as a microprocessor. The switch controller 110 controls the timing of when to open and close the switch 106 and for how long. Once the capacitive storage device 104 is charged, the mechanical switch 106 is fired, thereby slamming its contacts together and discharging the capacitive storage device 104 through the pulse forming network 108 (e.g., a 10 ohm resistor). When the mechanical switch 106 is turned off, the capacitive storage device 104 may be connected through ground through a bleeding resistor (not shown in FIG. 1).

Figure 2:
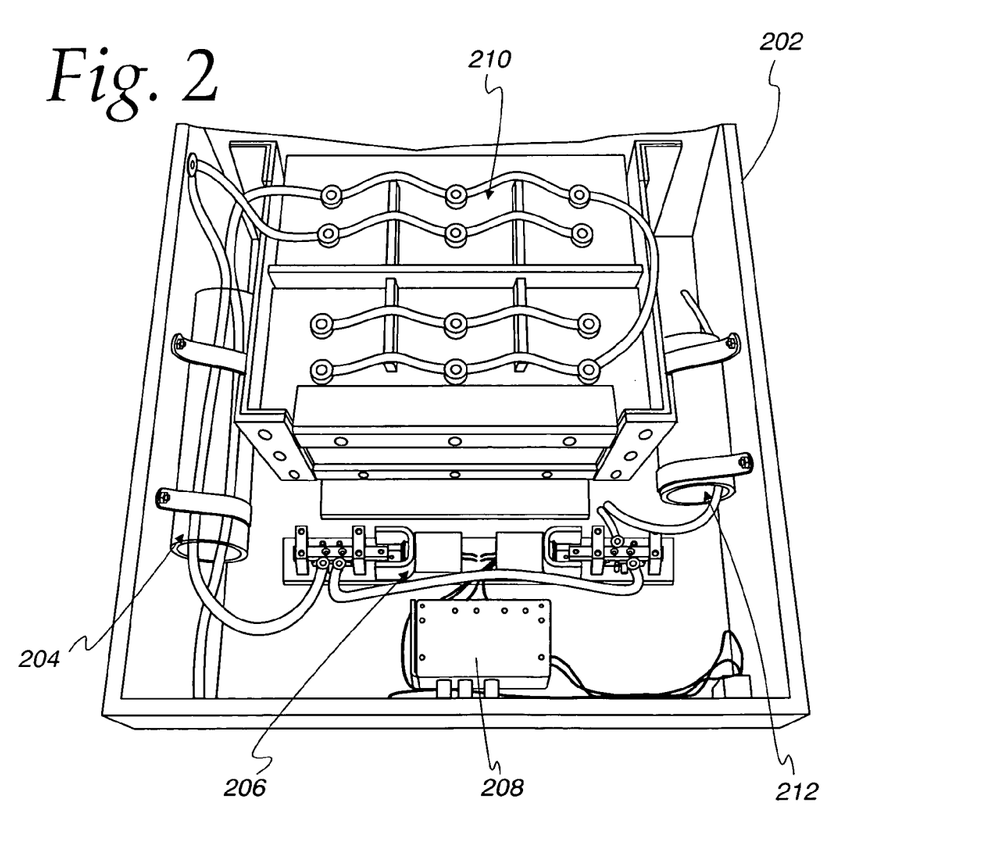
FIG. 2 is a perspective drawing of a system for generating a high voltage electromagnetic pulse according to various embodiments of the present invention.

Referring now to FIG. 2, an example of a system for creating an electromagnetic pulse is described. A housing 202 includes a safety (bleeding) resistor 204, mechanical switch 206, mechanical switch power supply 208, capacitive storage bank 210, and pulse forming network 212. A controller (not shown) controls the mechanical switch 206 and, in one example, is positioned outside the housing 202. An external power supply is coupled the capacitive storage bank 210. As shown, the capacitive storage bank 210 is a series connection of six 100 micro farad capacitors connected in series. The capacitive storage bank 210 is connected by a wire to the mechanical switch 206. The mechanical switch 206 is also connected to the safety resistor 204. The mechanical switch power supply 208 is coupled to the mechanical switch 206 and the mechanical switch 206 is coupled by a wire to the pulse forming network 212. In this case, the pulse forming network is a 10 ohm resistor. The output of the pulse forming network 212 is connected to a device or network under test.

The mechanical switch 206 is operative so as to allow the capacitive storage bank 210 to charge. Once the capacitive storage bank 210 is charged, the mechanical switch 206 is fired and this discharges the capacitive storage bank 210 through the pulse forming network 212 (e.g., a 10 ohm resistor). When the mechanical switch 206 is turned off, the capacitors are once again connected to ground through the safety resistor 204.

The capacitor storage bank 210 is positioned on a raised box in the housing 202. The wires used to provide connections are insulated in a material such as plastic. The mechanical switch 206 is positioned at the bottom of the housing 202 and is immersed in a dielectric substance. In one example, the dielectric substance comprises a dielectric gas with a high dielectric breakdown voltage such as a sulfur hexafluoride gas, a nitrogen-based gas, or a noble gas. The gas used may be pressurized or non-pressurized.

In other examples, the dielectric substance may be a dielectric liquid exhibiting a high voltage insulating quality. The dielectric liquid may be a petrochemical based oil, an organic-based oil, or de-ionized water.

Figure 3A:
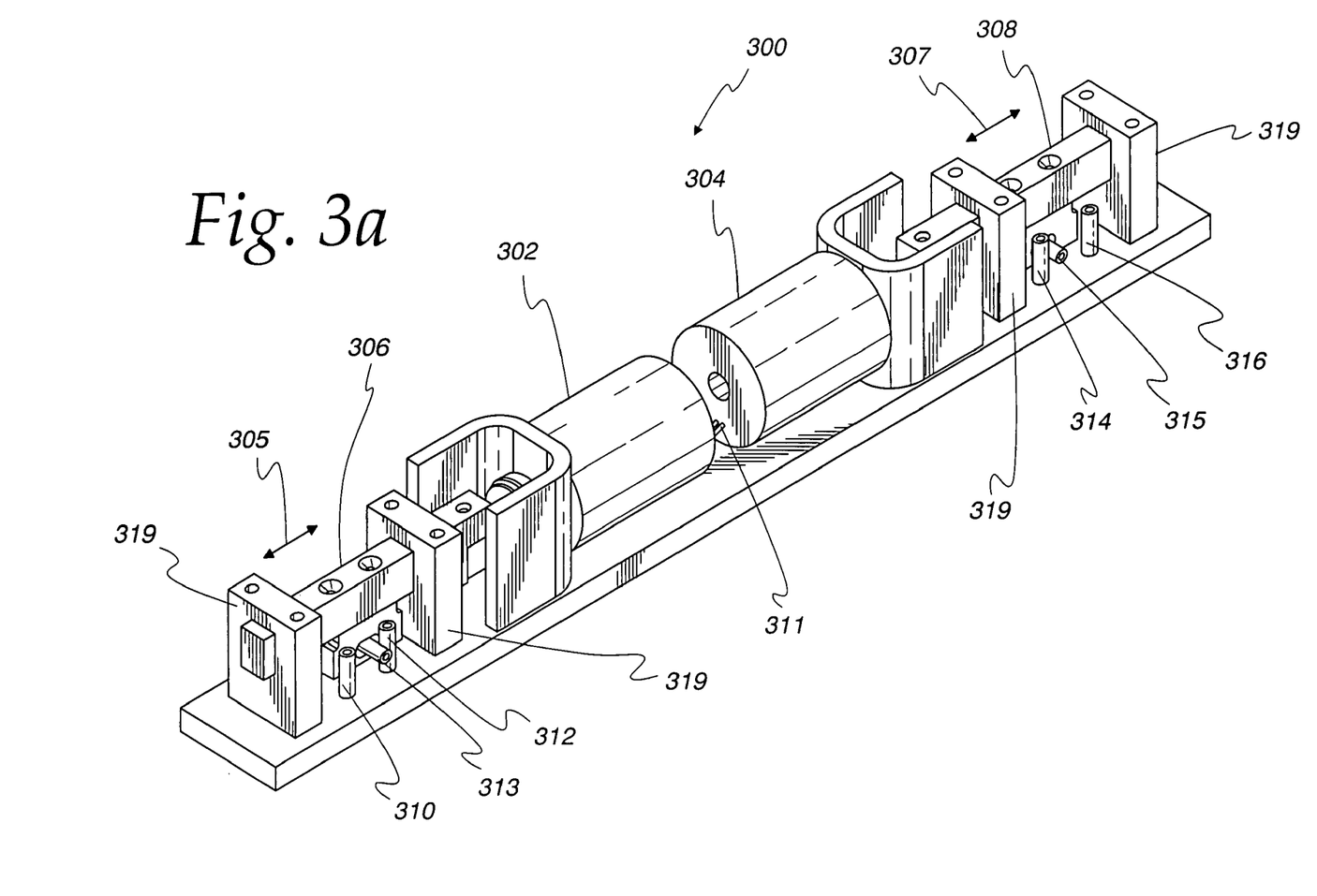
FIG. 3a is a perspective view of a switch for generating a high voltage electromagnetic pulse according to various embodiments of the present invention.
Figure 3B:
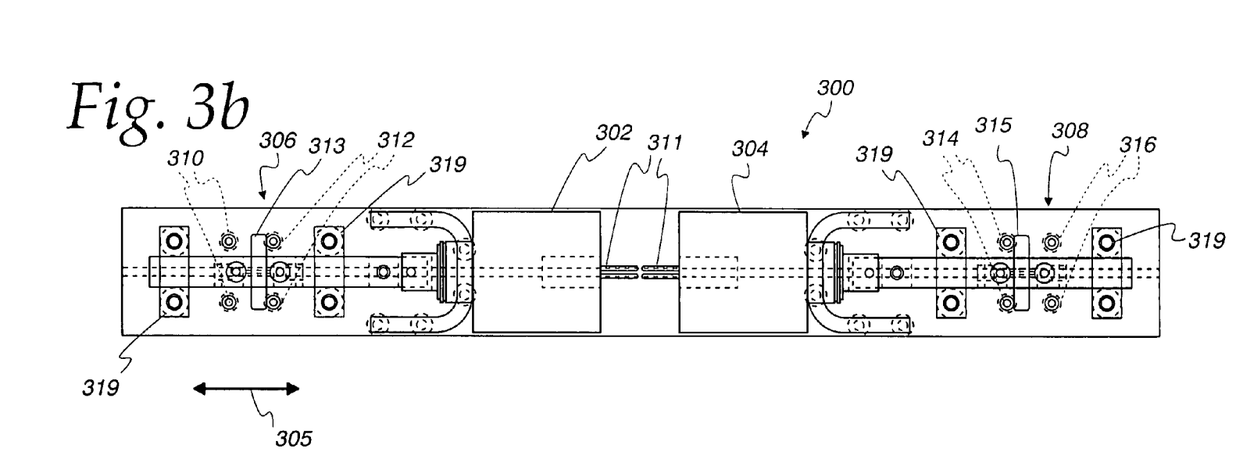
FIGS. 3b and 3c are top and side views of the switch of FIG. 3a according to various embodiments of the present invention.
Figure 3C:
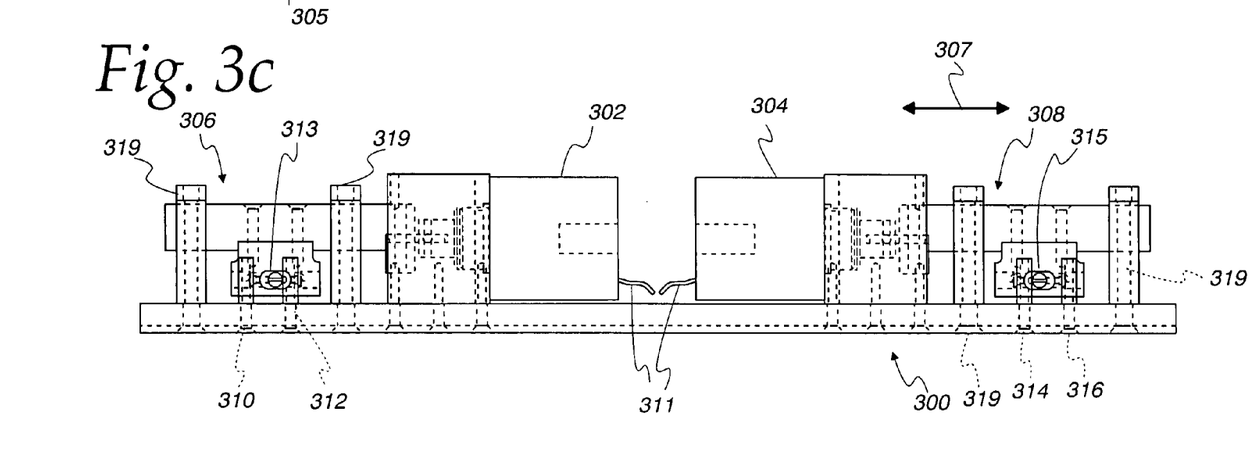

Referring now to FIGS. 3a, 3b, and 3c, one example of a dielectric insulated mechanical switch 300 is described. The switch 300 includes shuttle blocks 306 and 308, which are coupled to and driven by solenoids 302 and 304. The solenoids 304 and 302 are powered by an electrical power supply (not shown) via wires 311.

The shuttle block 306 include a contacting member 313 and the shuttle block 308 includes a contacting member 315. The contacting members 313 and 315 extend through the shuttle blocks 306 and 308. The solenoids 302 and 304 move the shuttle blocks 306 and 308 along the base of the switch 300 between different sets of contacts positioned along the switch 300. Specifically, the solenoid 302 moves shuttle block 306 in a direction 305 (between contacts 310 and 312) while the solenoid 304 moves the shuttle block 308 in direction 307 (between contacts 314 and 316).

Contacts 310, 312, 314, and 316 are provided and are connected to wires that provide electrical connections between the switch 300 and a capacitive storage device (not shown in FIG. 3) and the switch 300 and a pulse forming network (not shown n FIG. 3). For instance, the contacts 312 can be used to connect input the switch 300 to the capacitive storage device and the set of contacts 316 can be used to connect the output of the switch 300 to the pulse forming network. The contacts 310 can be used to connect the switch to a safety resistor (not shown) while the contacts 314 can be used to disconnect the switch from the pulse forming network.

The shuttle blocks 306 and 308 are secured and move within holders 319 and the holders 319 are attached to the base of the switch 300. Power supply wires 311 are coupled to and supply power to the solenoids 302 and 304.

In operation, and as mentioned, the movement and positioning of the shuttle blocks 306 and 308 completes the circuit between the capacitive storage device and the pulse forming circuit. Specifically, a controller (not shown in FIG. 3) activates the solenoid 302 to drive the shuttle block 306 (with the contacting member 313) between contacts 310 (providing a connection to a safety resistor) and 312 (providing a connection to contacts 314 and/or 316). The controller also activates the solenoid 304 to drive the shuttle block 308 (with contacting member 315) between contacts 314 and 316. In this way, the energy stored in the capacitive storage device is transferred to the pulse forming network and a high voltage pulse is created.

Figure 4:
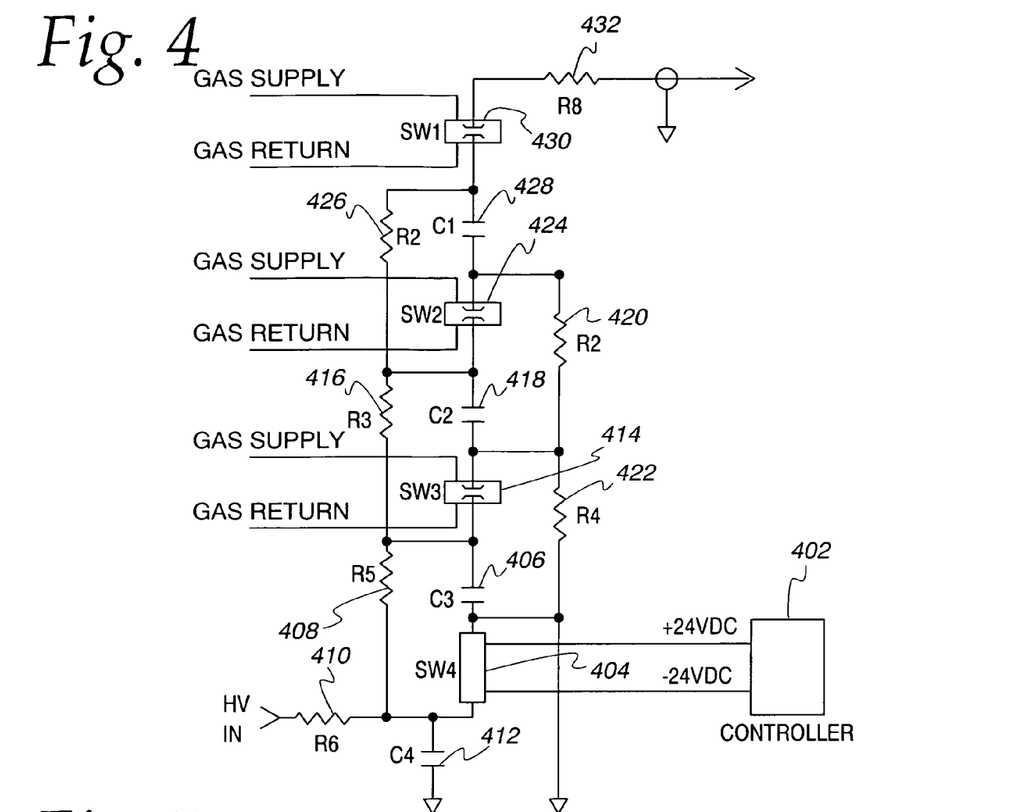
FIG. 4 is a circuit diagram of another example of a system for generating an electromagnetic pulse according to the present invention.

Referring now to FIG. 4, a system for creating an electromagnetic pulse is described. A controller 402 is coupled to a switch 404. The switch 404 is coupled to capacitors 406 and 412 and resistors 408 and 410. The resistor 408 is coupled to a relay 414 and a resistor 416. The relay 414 is coupled to a capacitor 418. The capacitor 418 and resistor 416 are coupled to a relay 424 and a resistor 426.

The relay 424 is coupled to a capacitor 428. The capacitor 428 is coupled to the resistor 426 and a relay 430. The relay 430 is coupled to a resistor 432, which is coupled to an output pin to provide the output pulse. Two resistors 420 and 422 are connected to relays 404, 414, and 424.

In one example, the resistors 408, 410, 416, 426, 420, and 422 may be 5 ohms and the resistor 432 may be 60 ohms. The capacitors 406, 412, 418 and 428 may be 50 nF capacitors. The switch 404 is filled with a gas or liquid dielectric such as nitrogen gas. The switches 414, 424, and 430 are also provided and insulated with a dielectric such as a gas. Other component values are possible.

The capacitors 406, 412, 418, and 428 are charged in parallel via charge resistors 410, 408, 416, and 426. The input HV IN is provided from a high voltage energy source such as a Spellman SL100P150 100 kV power supply. In one example, the relays may be PSI T-670 spark gap switches and the switch 404 may be a switch of the type described with respect to FIGS. 3a-c.

In operation, capacitors 406, 412, 418, and 428 are first charged as mentioned previously. The controller 402 activates the switch 404. Consequently, the capacitors 406 and 412 are connected with two times their charge voltage. This voltage discharges into the switch 414, which connects to the capacitor 418. The capacitor 418 then discharges into the switch 424 (at three times the charge voltage), which closes and discharges into the capacitor 428. As a result, the pulse is discharged at the output via resistor 432 at four times the charge voltage. The various elements and components described above may be placed in a housing and the housing may be filled with an insulating material such as Shell Oil Diala DX.

Figure 5:
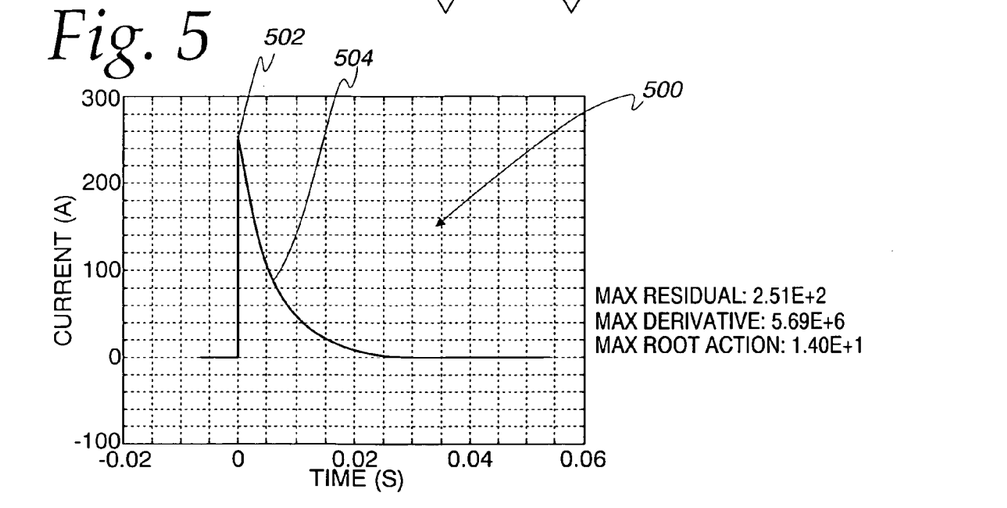
FIG. 5 is a graph of current at the switch versus time according to various embodiments of the present invention.

Referring now to FIG. 5, one example of a voltage waveform 500 created by the present approaches is described. The waveform 500 is a graph of current versus time. It can be seen that when the switch is closed at time zero, a pulse is created having a peak value 502. The pulse dissipates according to a curve 504. In this example, the pulse generation circuit forms a 1.5 microsecond rise time to 250 amps with a 10 ohm source impedance and an approximate 3-5 millisecond fall time.

Thus, approaches are provided that generate high voltage electromagnetic pulses. Advantageously, these approaches limit the impact on the rise rate of the electromagnetic pulse, can be used in both high and low voltage/current applications, and operate across a spectrum of hold-off voltages.

Those skilled in the art will recognize that a wide variety of modifications, alterations, and combinations can be made with respect to the above described embodiments without departing from the spirit and scope of the invention, and that such modifications, alterations, and combinations are to be viewed as being within the scope of the invention.

What is claimed is:

1. A system for generating a high voltage energy pulse comprising:
   a capacitive energy storage arrangement coupled to a direct current (DC) power supply, the capacitive energy storage arrangement for storing energy from the power supply;
   a pulse forming network for forming frequency contents of a high voltage energy pulse;
   a dielectric insulated mechanical switch coupled to the capacitive energy storage arrangement and the pulse forming network, the dielectric insulated mechanical switch being immersed in a dielectric substance; and
   a controller coupled to the dielectric insulated mechanical switch, the controller being programmed to selectively open and close the dielectric insulated mechanical switch so as to supply energy stored in the capacitive energy storage device to the pulse forming network and thereby forming the high voltage energy pulse.

2. The system of claim 1 wherein the dielectric insulated mechanical switch comprises a pair of electrodes driven by a mechanical spring.

3. The system of claim 1 wherein the dielectric insulated mechanical switch comprises a pair of electrodes driven by a solenoid.

4. The system of claim 1 wherein the pulse forming network comprises at least one resistive element and one inductive element.

5. The system of claim 1 wherein the pulse forming network comprises multiple resistive elements, multiple inductive elements, and multiple capacitive elements.

6. The system of claim 5 wherein the gas is selected from a group comprising a pressurized gas and a non-presurized gas.

7. The method of claim 6 wherein the dielectric liquid is selected from a group comprising petrochemical basied oils, organically based oils, and de-ionized water.

8. The system of claim 1 wherein the dielectric substance comprises a dielectric gas.

9. The system of claim 8 wherein the dielectric gas is a gas selected from a group with a high dielectric breakdown voltage such as comprising a sulfur hexafluoride gas, a nitrogen-based gas, and a noble gas.

10. The method of claim 1 wherein the dielectric substance comprises a dielectric liquid exhibiting a high voltage insulating quality.

11. A method of creating a high voltage energy pulse comprising:
   storing electrical energy in a capacitive storage arrangement;
   providing a dielectrically insulated mechanical switch, the dielectric insulated mechanical switch being immersed in a dielectric substance;

selectively switching the capacitive energy from the capacitive storage arrangement to a pulse forming network using the dielectrically insulated switch; and forming an high voltage energy pulse from the switched capacitive energy.

12. The method of claim 11 wherein providing a dielectrically insulated mechanical switch comprises providing a mechanical switch that is immersed and insulated by a dielectric gas.

13. The method of claim 12 wherein the dielectric gas is a gas selected from a group comprising a sulfur hexafluoride gas, a nitrogen-based gas, and a noble gas.

14. The method of claim 12 wherein the gas is selected from a group comprising a pressurized gas and a non-pressurized gas.

15. The method of claim 11 wherein providing a dielectrically insulated mechanical switch comprises providing a mechanical switch that is immersed and insulated by a dielectric liquid.

16. The method of claim 15 wherein the liquid is selected from a group comprising petrochemical based oils, organically based oils, and de-ionized water.

* * * * *

UNITED STATES PATENT AND TRADEMARK OFFICE
CERTIFICATE OF CORRECTION

PATENT NO. : 7,485,989 B2
APPLICATION NO. : 11/523879
DATED : February 3, 2009
INVENTOR(S) : Crain et al.

It is certified that error appears in the above-identified patent and that said Letters Patent is hereby corrected as shown below:

In the CLAIMS:
Claim 6, column 6, line 47, delete "non-presurized" and insert --non-pressurized--.
Claim 7, column 6, line 49, delete "basied oils," and insert --based oils,--.
Claim 10, column 6, line 58, delete "method" and insert --system--.

Signed and Sealed this

Nineteenth Day of May, 2009

JOHN DOLL
*Acting Director of the United States Patent and Trademark Office*

(12) INTER PARTES REEXAMINATION CERTIFICATE (1258th)
United States Patent
Crain et al.

(10) Number: US 7,485,989 C1
(45) Certificate Issued: Apr. 21, 2016

(54) TUNABLE ELECTRICAL TRANSIENT GENERATOR FOR ELECTROMAGNETIC PULSER

(75) Inventors: Charles Crain, Colorado Springs, CO (US); Philip Lane, Colorado Springs, CO (US); John McClure, Colorado Springs, CO (US); James Youngman, Woodland Park, CO (US)

(73) Assignee: L-3 COMMUNICATIONS CORPORATION, New York, NY (US)

Reexamination Request:
No. 95/001,862, Dec. 22, 2011

Reexamination Certificate for:
Patent No.: 7,485,989
Issued: Feb. 3, 2009
Appl. No.: 11/523,879
Filed: Sep. 20, 2006

Certificate of Correction issued May 19, 2009

(51) Int. Cl.
*H03K 3/00* (2006.01)
*H03K 3/64* (2006.01)
*H03K 3/53* (2006.01)

(52) U.S. Cl.
CPC ........................................ *H03K 3/53* (2013.01)

(58) Field of Classification Search
None
See application file for complete search history.

(56) References Cited

To view the complete listing of prior art documents cited during the proceeding for Reexamination Control Number 95/001,862, please refer to the USPTO's public Patent Application Information Retrieval (PAIR) system under the Display References tab.

*Primary Examiner* — Robert Nasser (57) ABSTRACT

A system for generating a high voltage energy pulse comprises a capacitive energy storage arrangement that is coupled to a direct current (DC) power supply. The capacitive energy storage arrangement stores energy from the power supply. The system also includes a pulse forming network for forming frequency contents of a high voltage energy pulse. A dielectric insulated mechanical switch is coupled to the capacitive energy storage arrangement and the pulse forming network. The dielectric insulated mechanical switch is immersed in a dielectric substance. A controller is coupled to the dielectric insulated mechanical switch. The controller is programmed to selectively open and close the dielectric insulated mechanical switch so as to supply energy stored in the capacitive energy storage device to the pulse forming network and thereby form the high voltage energy pulse.

INTER PARTES REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-3 and 8-16 are cancelled.

New claims 17-36 are added and determined to be patentable.

Claims 4-7 were not reexamined.

17. *The system of claim 1 wherein the dielectric insulated mechanical switch comprises a first shuttle block, the shuttle block having a first contact member extending through the first shuttle block, and wherein the contact member is adapted to contact a plurality of different contact positions of the dielectric insulated mechanical switch depending on a position of the first shuttle block.*

18. *The system of claim 17 wherein one of the plurality of the different contact positions is electrically coupled to the capacitive energy storage arrangement.*

19. *The system of claim 17 wherein one of the plurality of the different contact positions is electrically coupled to the pulse forming network.*

20. *The system of claim 17 wherein one of the plurality of the different contact positions is electrically coupled to a safety resistor.*

21. *The system of claim 17 wherein the first shuttle block is driven by a solenoid.*

22. *The system of claim 17 wherein the first shuttle block is movably secured within a holder attached to a surface of the dielectric insulated mechanical switch.*

23. *The system of claim 17 wherein the dielectric insulated mechanical switch further comprises a second shuttle block having a second contact member, wherein*

*the first contact member is adapted to move between a contact position for electrically coupling an electrode with the pulse forming network and a contact position for decoupling the electrode with the pulse forming network, and*

*the second contact member is adapted to move between a contact position for electrically coupling the electrode to the capacitive energy storage arrangement and a contact position for coupling the electrode to a safety resistor.*

24. *The system of claim 1 wherein the pulse forming network is immersed in the dielectric substance.*

25. *The system of claim 1 wherein the capacitive energy storage arrangement is immersed in the dielectric substance.*

26. *The system of claim 1 further comprising a housing, wherein the housing holds the dielectric substance for immersing the capacitive energy storage arrangement, the pulse forming network, and the dielectric insulated mechanical switch.*

27. *The method of claim 11 wherein the dielectric insulated mechanical switch comprises a first shuttle block, the shuttle block having a first contact member extending through the first shuttle block, and wherein the contact member is adapted to contact a plurality of different contact positions of the dielectric insulated mechanical switch depending on a position of the first shuttle block.*

28. *The method of claim 27 wherein one of the plurality of the different contact positions is electrically coupled to the capacitive energy storage arrangement.*

29. *The method of claim 27 wherein one of the plurality of the different contact positions is electrically coupled to the pulse forming network.*

30. *The method of claim 27 wherein one of the plurality of the different contact positions is electrically coupled to a safety resistor.*

31. *The method of claim 27 wherein the first shuttle block is driven by a solenoid.*

32. *The method of claim 27 wherein the first shuttle block is movably secured within a holder attached to a surface of the dielectric insulated mechanical switch.*

33. *The method of claim 27 wherein the dielectric insulated mechanical switch further comprises a second shuttle block having a second contact member,*

*wherein, the first contact member is adapted to move between a contact position for electrically coupling an electrode with the pulse forming network and a contact position for decoupling the electrode from the pulse forming network, and*

*the second contact member is adapted to move between a contact position for electrically coupling the electrode to the capacitive energy storage arrangement and a contact position for electrically coupling the electrode to a safety resistor.*

34. *The method of claim 11 wherein the pulse forming network is immersed in the dielectric substance.*

35. *The method of claim 11 wherein the capacitive energy storage arrangement is immersed in the dielectric substance.*

36. *The method of claim 11 wherein the capacitive energy storage arrangement, the pulse forming network, and the dielectric insulated mechanical switch are immersed in the dielectric substance and are enclosed in a housing.*

\* \* \* \* \*